US008527245B2

(12) United States Patent
Weisz

(10) Patent No.: US 8,527,245 B2
(45) Date of Patent: Sep. 3, 2013

(54) ELECTRONIC DATA PROCESSING SYSTEM FOR AUTOMATIC OR SEMI-AUTOMATIC DESIGN AND DESIGN METHOD

(76) Inventor: Harald Weisz, Munich (DE)

(*) Notice: Subject to any disclaimer, the term of this patent is extended or adjusted under 35 U.S.C. 154(b) by 427 days.

(21) Appl. No.: 13/029,429

(22) Filed: Feb. 17, 2011

(65) Prior Publication Data

US 2011/0202319 A1     Aug. 18, 2011

(30) Foreign Application Priority Data

Feb. 18, 2010   (DE) .......................... 10 2010 008 478

(51) Int. Cl.
*G06F 17/50*     (2006.01)
(52) U.S. Cl.
USPC ............................................................. 703/1
(58) Field of Classification Search
USPC ............................................................. 703/1
See application file for complete search history.

(56) References Cited

U.S. PATENT DOCUMENTS

| | | | | |
|---|---|---|---|---|
| 5,691,909 | A * | 11/1997 | Frey et al. ...................... | 700/159 |
| 6,219,586 | B1 * | 4/2001 | Sakai ............................. | 700/182 |
| 2004/0186698 | A1 * | 9/2004 | Kondo et al. .................... | 703/2 |
| 2004/0186793 | A1 * | 9/2004 | Harmand et al. ................ | 705/27 |
| 2006/0106757 | A1 * | 5/2006 | Sakai et al. ..................... | 707/2 |
| 2008/0276184 | A1 * | 11/2008 | Buffet et al. .................... | 715/752 |

FOREIGN PATENT DOCUMENTS

| | | |
|---|---|---|
| DE | 10356399 A1 | 6/2006 |
| DE | 10 2005 006 071 A1 | 8/2006 |
| DE | 10 2007 013 499 A1 | 9/2008 |
| DE | 10 2008 047 958 A1 | 5/2009 |

OTHER PUBLICATIONS

Wolfgang Kuhn, L.F. Perrone, F.P. Wieland, J. Liu, B.G. Lawson, D.M. Nicol, R.M. Fujimoto, "Digital Factory-Simulation Enhancing the Product and Production Engineering Process" Proceedings of the 2006 Winter Simulation Conference, pp. 1899-1906.*

(Continued)

*Primary Examiner* — Dwin M Craig
(74) *Attorney, Agent, or Firm* — Hoffman Warnick LLC

(57) ABSTRACT

Electronic data processing (EDP) system for automatic or semi-automatic design, including of at least one storage unit, at least one computer unit, a user interface, and at least one interface to other EDP systems, characterized in that:

a) the computer unit leads the user through an iteration sequence of synthesis and analysis of a future useful technical object in that it
b) offers to the user via a menu structure selection possibilities originating from the storage unit of kinematic, kinetic, material, geometric and form-related data,
c) invites the user to complete these data corresponding to the task,
d) processes, stores and compares these data with known data contained in the storage unit,
e) sets out the processed data and the results of the comparison on the user interface, informs the user of admissible and/or inadmissible deviations and invites the user to carry out further decisions and data inputs,
f) for so long until all the deviations lie within admissible ranges, and by reference to the form-related instructions stored in the storage unit formulates technical documentation with the manufacturing and operating instructions for the future useful technical object, stores it and makes it available to the user on the user interface for further processing.

12 Claims, 14 Drawing Sheets

(56) References Cited

OTHER PUBLICATIONS

Q. Jeffrey Ge, "Kinematics-Driven Geometric Modeling: A Framework for Simultaneous NC Tool-Path Generation and Sculptured Surface Design" Proceedings of the 1996 IEEE International Conference on Robotics and Aitomation Minneapolis, Minnesota—Apr. 1996, pp. 1819-1824.*

Shih-Lianf Wang, "Mechanism Simulation With Working Model" IEEE 1996, pp. 1102-1106.*

Karlheinz Roth, Konstruieren mit Konstruktionskatalogen, (Design with Design Catalogues), Springer-Verlag, 2000, 15 pages.

Gerhard Pahl et al., Konstruktionslehre, (Design Studies), Springer-Verlag, 2007, 19 pages.

VDI-Richtlinien, Verein Deutscher Ingenieure (VDI) (Association of German Engineers), 1993, 4 pages.

* cited by examiner

ELECTRONIC DATA PROCESSING SYSTEM FOR AUTOMATIC OR SEMI-AUTOMATIC DESIGN AND DESIGN METHOD

RELATED ART

Design is an activity which is still carried out by humans at the present time, wherein the manufacturing or formulation and operating instructions are created for a future useful technical object. This activity consists of both the synthesis and the analysis of an object which are realised in an iterative sequence by the designer, whereby there are on the one hand the desired target properties of the object to be created and on the other hand the physical, chemical and economic restrictions to which the object is subject. The result of the designing process is technical documentation which is also called the design. The designer, with his experience but also with his subjectivity, is thereby the one who selects in the synthesis those elements which are to be put together and formulates the restrictions in the analysis. For this reason there are various opinions concerning whether design can be taught, whether design is a science or whether design is an art. The fact is that both the subjectivity and also the degree of experience of each individual designer, which influence to a large extent the design process and thereby also the object designed, lead to two designers never delivering the same design or the objects designed by two designers under identical target formulations having different forms and properties. This situation leads to long and controversial discussions, also at teaching establishments.

Not so long ago the designer had merely a few drawing aids, a slide rule or pocket calculator available to him and, besides the actual design, also had to have drawing skills in order to provide a document in the form of a technical drawing which is subject to certain standards. At the present time the designer does not need to have drawing skills because so-called CAD programs as well as analysis and simulation programs are available to him on more or less powerful computers, but the design is still left to him. A few useful tools are thereby provided to the designer which principally facilitate his work in the analysis and representation of the design objects, but whereby the degree of subjectivity of the designer is retained as previously. What is more, the models and drawings formulated on the computer which sometimes in fact appear nearly natural and of high optical quality are deceiving in relation to the defects contained in the design and this can sometimes have fatal consequences.

This situation is known and various trials have already been carried out in order to reduce the degree of subjectivity in the design activities, predominantly with the support of electronic data processing (EDP) systems.

In the textbooks currently in circulation a multitude of suggestions are offered having regard to scientific aspects and which offer a prospect of computer-aided design. As this literature is very extensive and is in fact highly scientific merely the representatives of two important teaching establishments will be mentioned below.

In "Konstruieren mit Konstruktionskatalogen" ["Design with Design Catalogues"] by K. Roth (Springer-Verlag, 2000) so-called function structures are described, with the aid of which one arrives via structure function elements (SFE) at a form element, but whereby this leads to a very large number of solution possibilities and in the end the designer must indeed make a subjective decision. As the matter relates here to purely scientific considerations the suggestions are only of informative significance for a designer—who is actually always under time pressure.

In "Konstruktionslehre" ["Design Studies"] by Pahl/Beitz (Springer-Verlag, 2007) several possible approaches are set out. Work steps are suggested for the design, drafting and formulation of a utility object, whereby these work steps do indeed produce a meaningful and correct sequence of the design process but only from the viewpoint of a theoretician. This makes their use in reality not impossible, but their theoretical nature makes them hard to realise for practising designers. The reason for this is as follows: When a designer is trained he learns, besides mathematics, material studies, strength of materials studies and other subjects, also the machine elements which were indeed themselves once an object of design processes. Whether these are standardised or non-standardised machine elements, they have all been designed at some time by a designer or by a team of designers. Through the deliberate, sometimes also unintentional, perception of these machine elements, the design intention of the designer becomes clear for the trainee and as a later designer he will always ask himself the question: "Where have I already seen something like that before?" and he will make use of this knowledge in order to solve his design problem. He will base his approach less upon theoretical methods. In this work it is then finally also ascertained that also in future the degree of creativity of the designer will be decisive in the implementation of the design.

Similar examples to those just described are found in the guidelines of the *Verein Deutscher Ingenieure* (VDI) (Association of German Engineers), for example in VDI guidelines 2221 and 2225. The disadvantages are the same.

In DE 103 56 399 B4 a data processing system is described—although arising from the field of computer science—with the aid of which on the basis of a query output values are generated and in this connection the rules concerning the formulation of the output values are indicated. Although this is from a different branch there are still analogies with the design process for a material technical form. Various output values can be generated here by means of the production of rules. However, fixed rules with a scientific basis are applied in the design process on the one hand which cannot be averted and cannot be modified. On the other hand, as is the case here, the combination rules of the machine elements used can in principle be modified, whereby in each case another technical form can arise.

In the application laid open for public inspection DE 10 2008 047 958 A1 a method for load-dependent design of a component is set out. This method describes how the data of an analysis are ascertained on an already designed and manufactured part and flow in a further iteration sequence to the design. However, the production/manufacture of a new part is thereby necessary each time, which points to the method of trial and error.

In the application laid open for public inspection DE 10 2007 013 499 A1 a method for designing a technical object is described. The method described here describes the use of standardised components in the design of a new object, but explicitly leaves the design to the designer and thus to his experience and subjectivity.

The application laid open for public inspection DE 10 2005 006 071 A1 does indeed describe an "intelligent, semi-automatic, 2D-3D design for CAD" but the teaching disclosed here has been standard since the 1980s and is described in the next paragraph.

At the present time there are professional CAD systems such as for example Pro/E, Catia, SolidWorks and many more, wherein there is officially no longer drawing but instead modelling and then a semi-automatic formulation of the technical drawing of the modelled object is offered. However, for the modelling the user must have a command of the most important rules of drawing, i.e., of geometry in any case, because the program only does as specified by the user. CAD systems have brought about, in comparison with work on the drawing board, an enormous simplification in the illustration of objects. In some CAD systems there is already an associativity between the different illustration modes, whereby this also brings with it a reduction in the number of error sources. Views, sections, cut-outs, etc., can be produced relatively easily and they all correspond to applicable drawing standards with a few exceptions. However, the most important activity, namely the design itself, is left to the designer as previously. Further, the designer must also now deal with the syntax and semantics of the respective CAD system. The command structure contains a number of possible commands which have different effects in different contexts and mean that the designer is more or less hindered in his actual task. This can be best seen in relation to CAD drawings: they contain many views because they are easy to generate but on the other hand they very often lack dimensions, tolerances, form and position tolerances, etc., because the CAD system cannot take over this for the designer. He must thus inform the system which view, on which scale is desired and which dimensions must be illustrated where. This means that the user is, as previously, still responsible for how much information and of which quality is contained in the technical drawing, i.e., in the technical documentation. This means that even in case of the CAD systems the same object is represented differently by different designers, although the same drawing should still actually always be produced for the same part. The simulation and calculation systems also constitute—when correctly used—an extensive tool. However, after a calculation or simulation has been carried out only the physical states precisely in the examined form are set out. The decision concerning whether and which geometric or physical data are to be modified in order to achieve an optimisation of the object examined is taken, as previously, by the user of these programs or it can in principle also not be revealed whether there is a possibility of an improvement in the constructive sense or not.

SUMMARY OF THE INVENTION

The inventive EDP system is intended to: provide assistance to eliminate these defects; reduce the costs for a high quality design; reduce the duration of the design process; reduce the necessary volume of discussion to a minimum; and in particular to eliminate error sources.

DETAILED DESCRIPTION OF THE INVENTION

Figure 1:
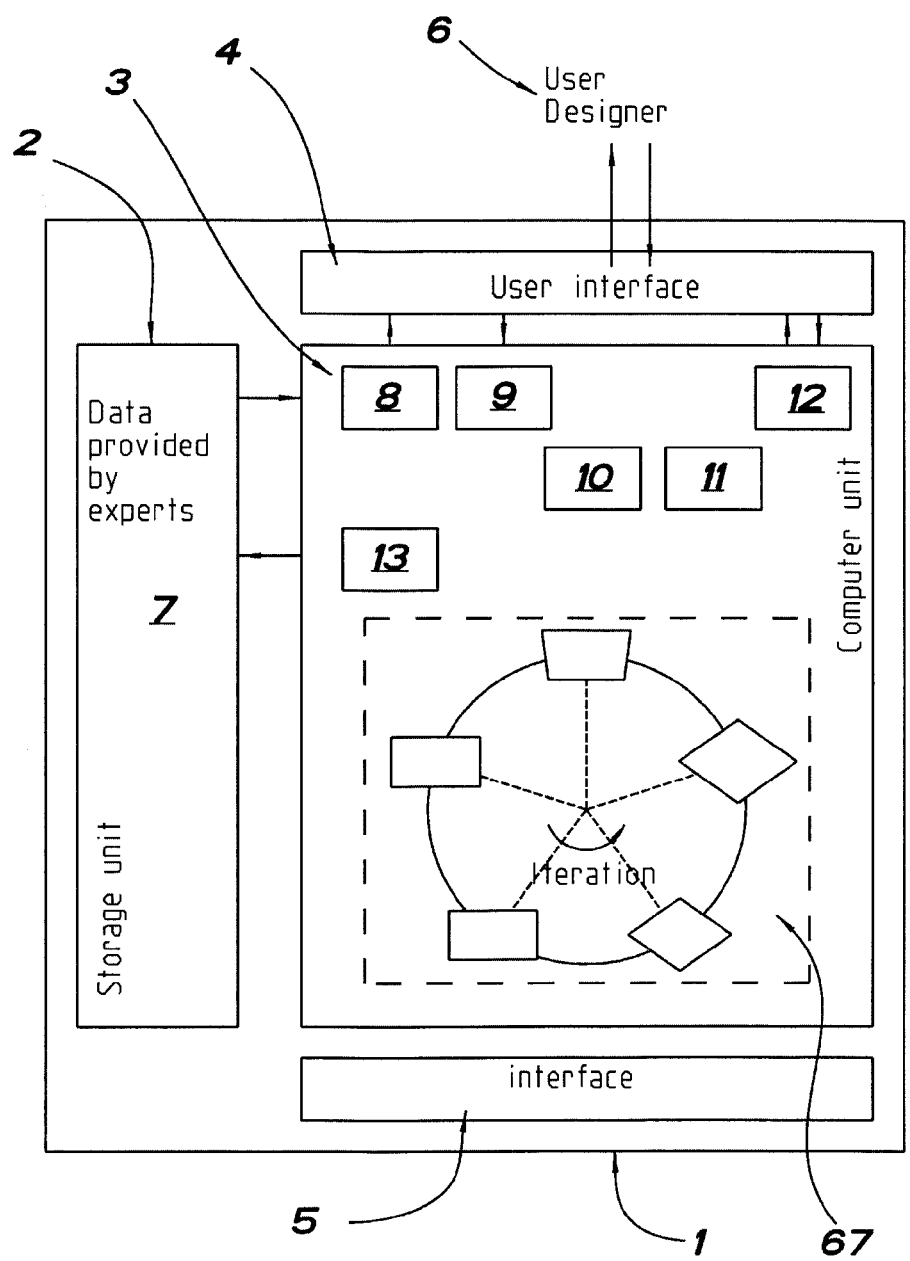
FIG. 1 shows an EDP system in accordance with an embodiment.

As shown in FIG. 1, the invention relates to an electronic data processing (EDP) system 1 which provides the user or the designer 6 with all or at least the majority of the currently known design means, in particular for mechanical design, in order to bring the design of a future useful object as close as possible to the target specifications. The EDP system 1 gives different designers the possibility of achieving under the same preconditions a virtually identical or at least a similar result, provides the possibility for discussions and decisions at an early stage, eliminates errors originating from the designer, takes trivial activities away from the designer, and provides the designer with the possibility of profiting from the findings of the technical sciences without having to assimilate a particularly in-depth knowledge himself. The technical sciences include, for example, mathematics, mechanics (with hydrostatics and dynamics), strength of materials, thermodynamics, materials, theory of machine elements, production technology, gearings, design, etc., in order to name just the most important ones.

In order to be able to better describe the inventive EDP system 1, the design process, the design activity, or merely the design will now be defined. This is also necessary because on the one hand the word "design" describes the product, the process from which it results, and the location where the process takes place, and on the other hand the attempted definitions from the relevant literature are incomplete.

Definition of Design: A design is the sum of all activities which, triggered by an objective task, are carried out using findings from the technical sciences during the synthesis-analysis-iteration sequence and the formulation of a technical document with the production and operating instructions of a future useful form.

Design is not a heuristic activity but it has an inventive character because it is based on the one hand upon sound knowledge but on the other hand requires from the designer in any case a certain anticipatory ability to combine what is already known.

In contrast, the development of a future useful object also constitutes a sequence of iterations, but in a greater multitude of activities which can also have a heuristic character and there can be a design process in the course of each given iteration step. Design is a constituent part of a development. The development of a future useful object can contain in its sequence one or more design sequences which are dependent or independent in relation to each other.

A technical document generally consists of assembly drawings, item lists, individual part and production drawings, descriptions, instructions, models, and programs.

The inventive EDP system 1 implements the design process using the inventive method.

The inventive EDP system 1 shown in FIG. 1 includes at least one storage unit 2, at least one computer unit 3, a user interface 4, and at least one interface 5 to other EDP systems. The user 6, generally the designer, uses the EDP system 1 via the user interface 4.

The inventive EDP system 1 ensures the sequence of the inventive method 67, and conducts a dialogue between the computer unit 3 and the user 6. The EDP system 1 thereby makes suggestions 8 to the user from the data 7 stored in the storage unit 2. The user 6 selects one of the suggestions 8 and adds data 9, following which the system checks these data for consistency 10 and carries out more extensive calculations 11, if necessary, requesting a new input 12 or going to the next step of the sequence 13. The suggestions made by the computer unit 3 come from libraries which are stored in the storage unit 2 and which are provided by experts or scientists with the necessary current data. That is to say that the EDP system 1 carries out via the method its own design and the user 6 merely controls the sequence in order to arrive at the design of the future object desired by him. What is more, the EDP system 1 forces the user 6 to correctly select and dimension the design elements.

Figure 2:
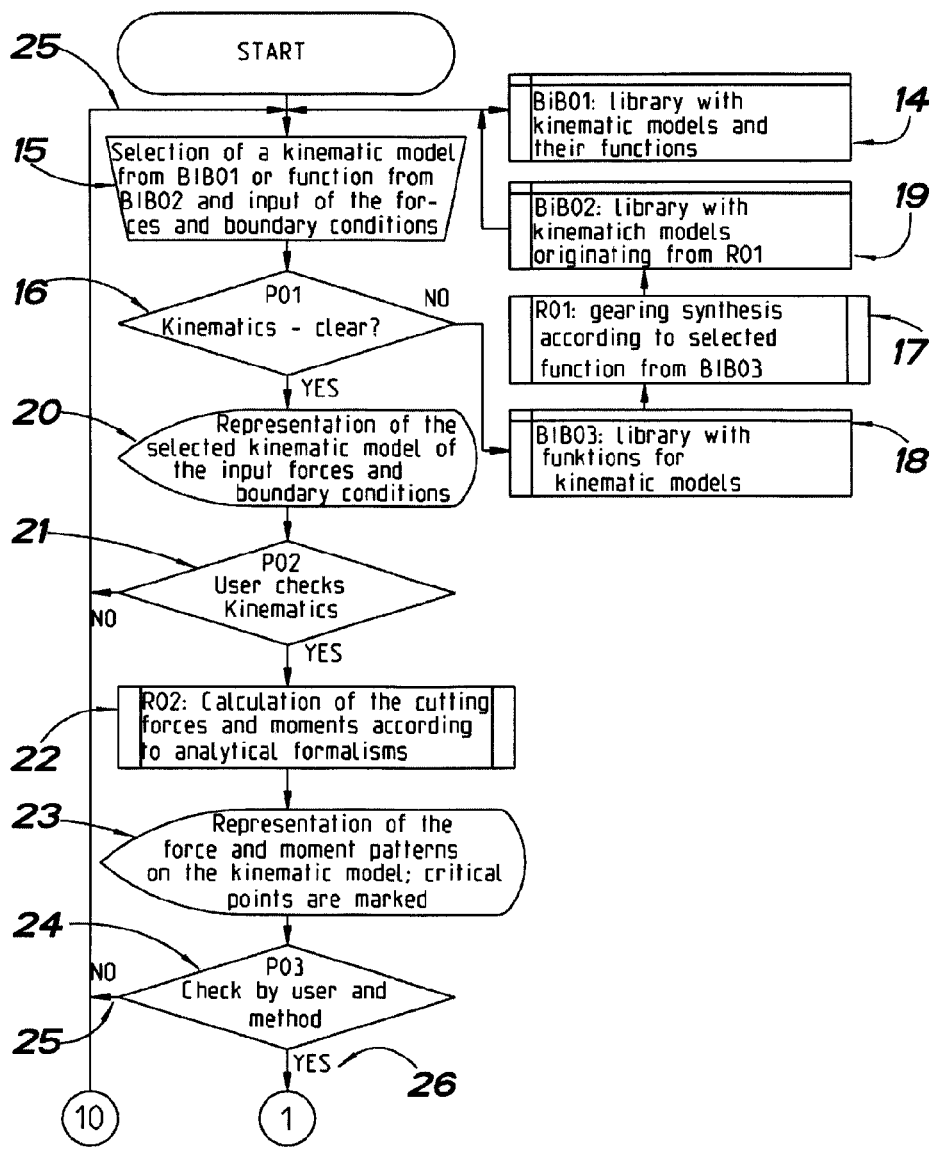
FIG. 2 depicts a portion of the inventive method in which kinematics, loads, and boundary conditions are defined.

At the start of the method, FIG. 2, the user is provided from a library 14 with a table with kinematic models of mechanisms 15, from which the user can select a mechanism, whereby the selected mechanism describes most closely from a kinematic viewpoint the future object to be designed. The user does not thereby need to be an expert in mechanisms, but must merely have a basic knowledge in this field, which is a precondition for a designer. If the user does not find a satisfactory mechanism form in the selection table suggested by the system 16 the EDP system offers the user the possibility of generating a mechanism via a synthesis program 17 for mechanisms by inputting the desired function 18, whereby the user stores the mechanism in the library for mechanisms 19, observes it on the user interface 20, and uses it from there for further processing. Here, the user has the possibility of conducting discussions 21 with other colleagues involved in the design process relating to the properties of the selected kinematic models and possible external decision-making aids.

With the selection of the kinematic model all the data necessary for this model are now available to the user and the user is asked to fix the dimensions, boundary conditions, and loads requested by the system 15 and indeed in the form that the kinematic model is represented on the user interface 4, 20 in such a way that the user inputs the data required by the method into correspondingly represented windows so that the consistency of the inputs is easy to obtain. The system forces the user to input all required data. Only when there is a complete data set does the system assume the complete kinematic calculation of the model 22 by reference to the analytical formalisms and publishes all data on the user interface 4, 23. All cutting forces, moments, all force paths, all movements in the form of path, speed and acceleration are now visible for the user 23. These data are consistent and credible and can thus serve as a basis for further factual discussions. If the discussions lead to an unsatisfactory result 24 there is the possibility either of changing the incorporated data or selecting another kinematic model 25 and carrying out a further iteration.

Figure 3:
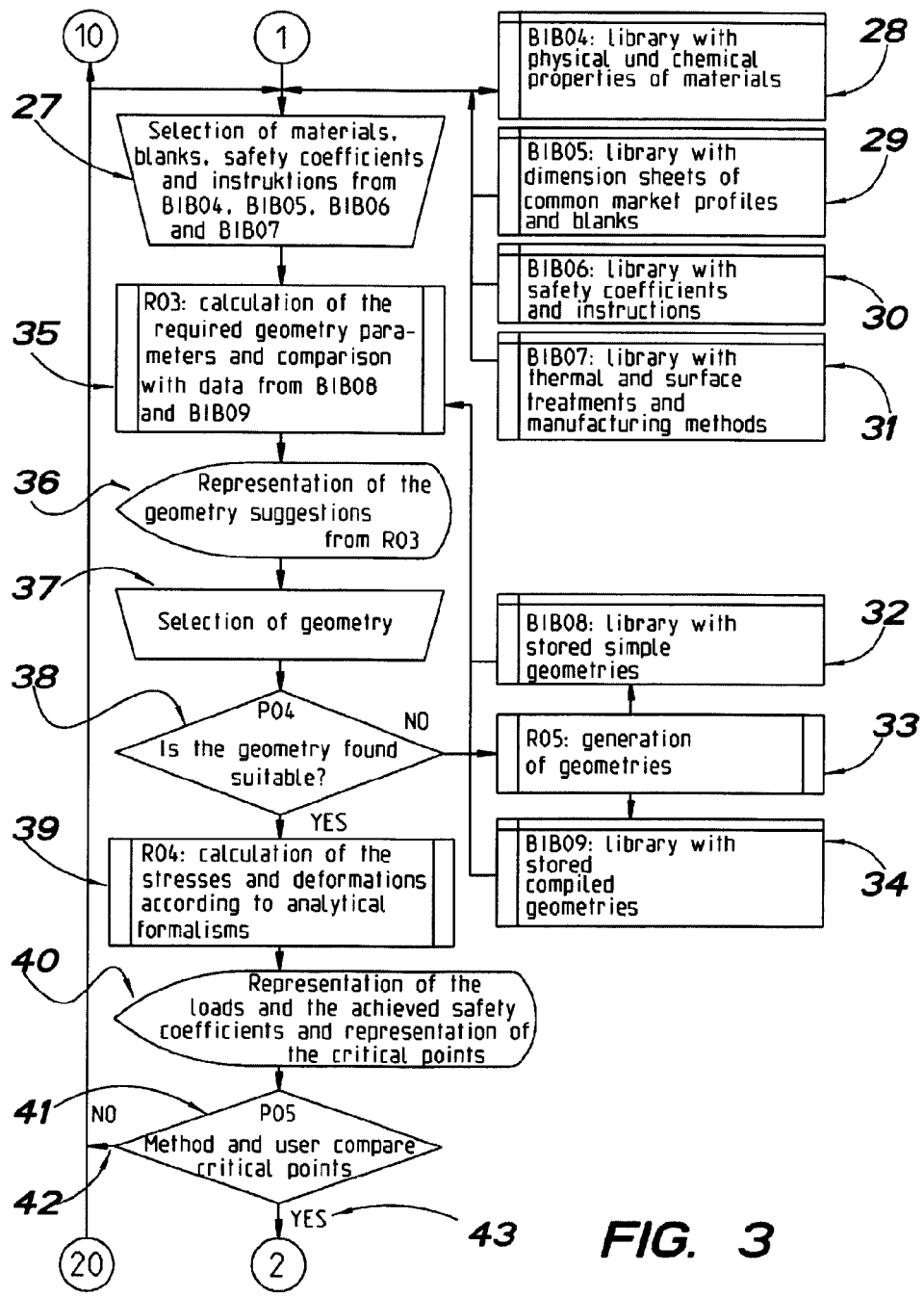
FIG. 3 depicts a portion of the inventive method in which materials, blanks, geometries, and safety coefficients are fixed.

If the kinematic model is now fixed or known with all its data 26 the EDP system provides the user with a further selection possibility on the user interface, FIG. 3, and indeed all data concerning materials, geometric forms, blanks and safety coefficients are asked here 27. The user can select here which materials 28 come into consideration for the project and the blanks (sheets, profiles, etc.) available on the market in the selected material 29. After completion of all indications, with safety coefficients 30 and instructions for thermal and surface treatments 31, the system calculates 35 all necessary geometry parameters and provides on the user interface geometries 36 originating from the libraries 32 which have been generated on the basis of the force conditions and the force paths. The user can now select a geometry 37, or 38 the user can generate geometries himself 33 which can also be stored 34 after checking of the measurement consistency and then be offered by the system for selection. The system also forces the user to activate all required indications here. The system now calculates 39, likewise via the analytical formalisms which are stored for the selected mechanism and the participating elements in the libraries, all arising stresses which are set out on the user interface. At the same time the corresponding safety coefficients are also evaluated by the system and set out 4, 40. The points are highlighted where the safety coefficients have fallen short or are exceeded. In both cases the user must go back a step in the iteration sequence 41, 42 and correspondingly change the input data and have a further calculation carried out by the system. Only when all data correspond to the specifications can the user go to the next method point 41, 53. At this time there is again the possibility of the user subjecting the results achieved to an objective discussion because the data are also clearly consistent and credible. At this point one can either go back a step in the method and decide on other materials or other geometries or even decide on other safety coefficients and trigger a repetition of this method step 42, or go to the next step in the method 43.

Figure 4:
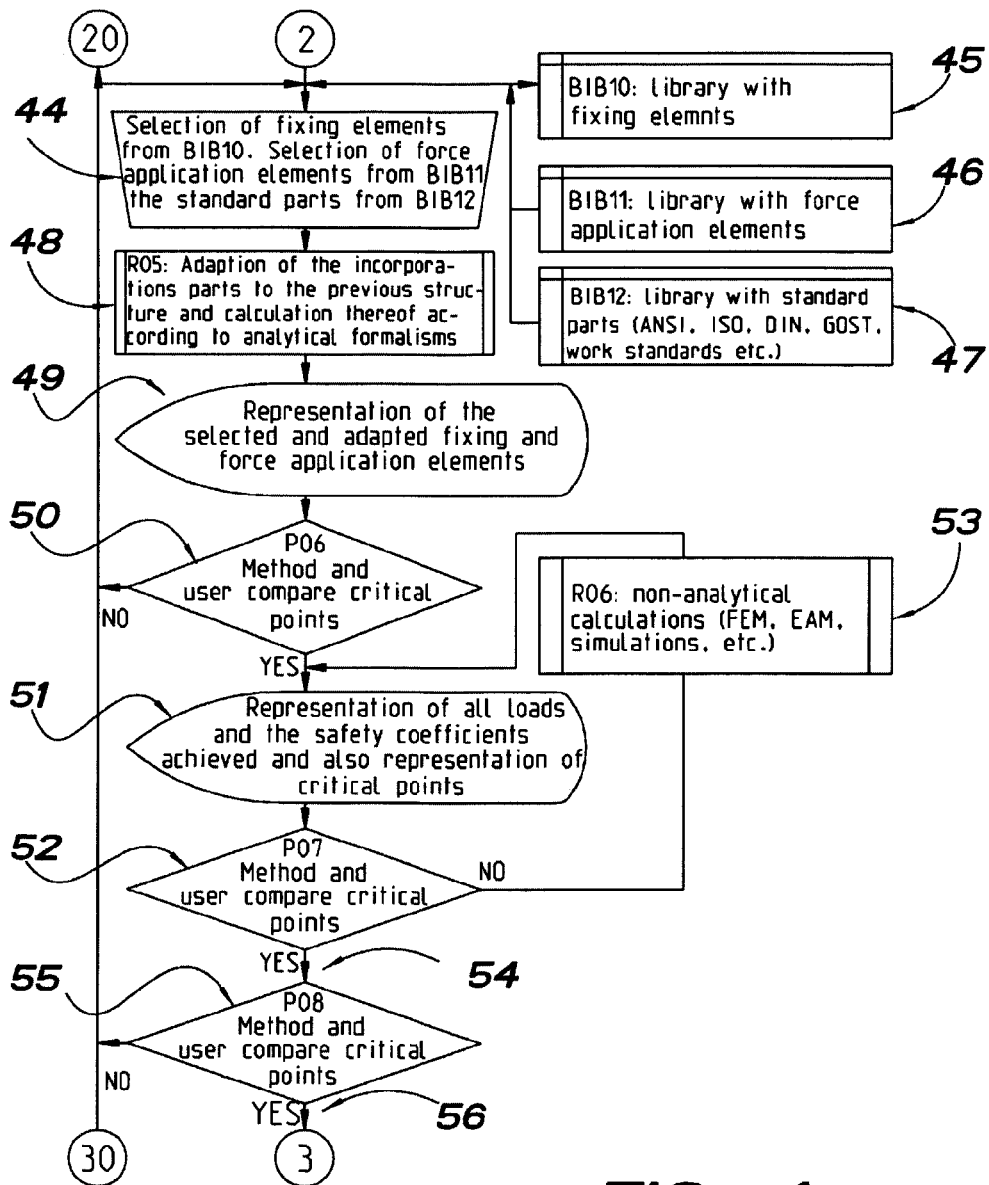
FIG. 4 depicts a portion of the inventive method in which fixing elements, force application elements, and standard parts are fixed.

Next, FIG. 4, the system offers to the user a selection possibility 44 for fixing elements 45 and force application elements 46 and the associated standard parts 47 with the corresponding safety coefficients. These are adapted to the existing structure using the computer unit 48 and set out on the user interface 49, following which the user can check his selection or carry out changes 50. If necessary, the user can now exchange possibly different fixing elements or force application elements and also standard parts or change them in their size and number. The user can change safety coefficients or can, if desired or necessary, go back a step in the method or go back two steps and provide new inputs. If, however, the results are in order and the safety coefficients lie within the predefined framework there is now again the possibility of discussion. There is also here the possibility 52 of feeding the thus formed design object to an external program 53, in which operating states can be simulated, or where for example there can be a quite precise calculation with the FEM stresses and this can be set out on the user interface 51 in order to be able to reach decisions concerning further changes which are then worked into one of the preceding steps of the method.

Figure 5:
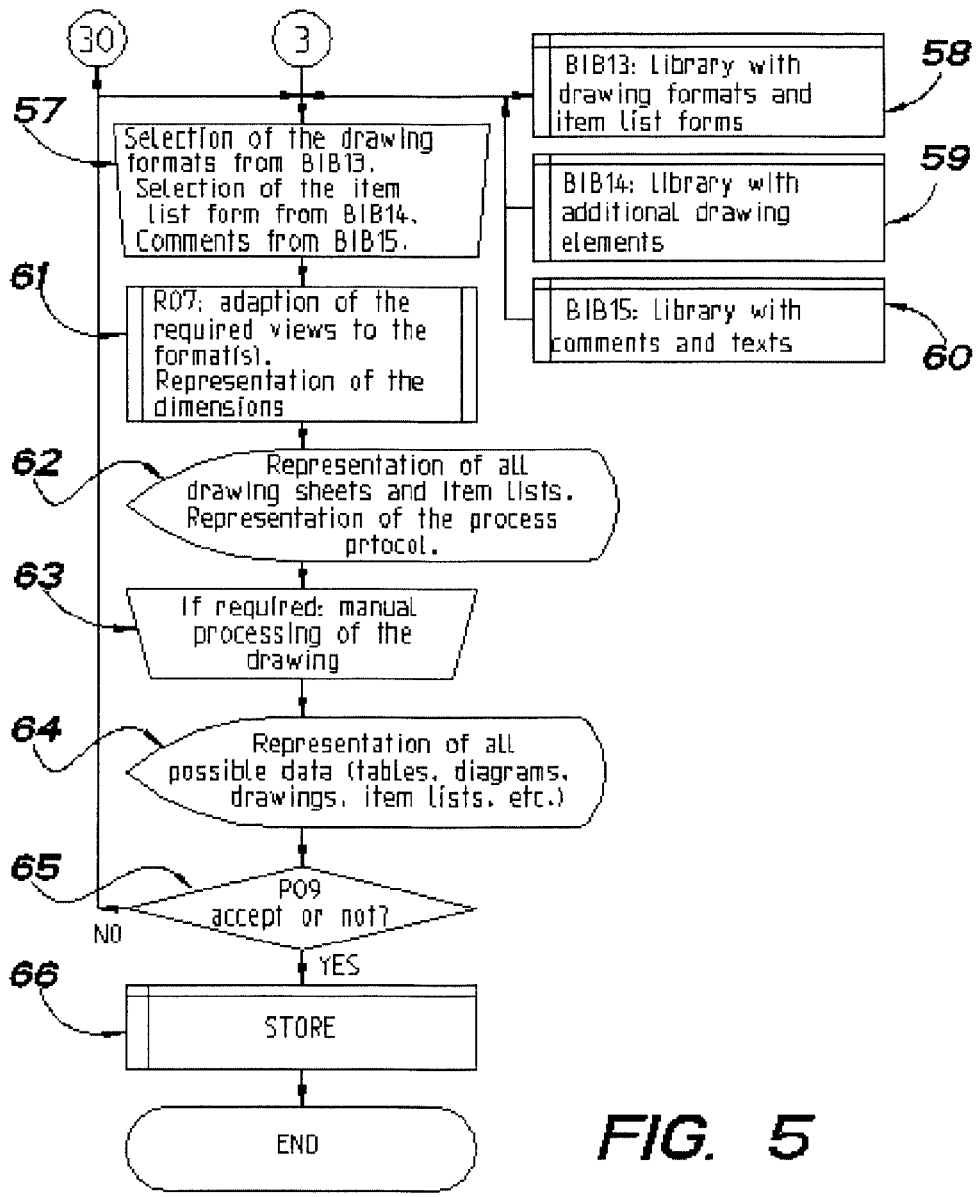
FIG. 5 depicts a portion of the inventive method in which the technical documentation is formulated.

If the results of the strength calculations are satisfactory 54, 56 the user can select the next step in the method, FIG. 5, and represent the design object in a technical drawing 57. For this, the system offers different drawing and item list formats 58, additional drawing elements 59 and additional drawing texts 60, from which the user makes a selection. The system decides 61 on the basis of the drawing category, assembly drawing or detailed drawing and also on the basis of the topology of the design object which is the most important and thus the main view, which are the least necessary views, sections and cut-outs to be represented and determines within the scope of the applicable drawing standards where, with which dimensions, and with which tolerances the representation will be made. Then the drawings are displayed to the user for viewing on the user interface 62. The user now has the possibility of inserting less relevant notes into the drawing 63 and looking at everything again 64. He does not have the possibility of changing any dimensions or tolerances without re-calculating the design object 65.

The whole sequence of the method is recorded and stored 66 by the EDP system and it can be precisely reproduced which inputs originate from the user and which data from the system or its libraries.

The libraries with the kinematic models are dealt with by gearing specialists or scientists who have the scientific background to produce and input qualified models with the necessary formalisms, whereby this allows the user of the inventive EDP system to resort to great knowledge without having to procure it for himself.

The same applies to the libraries which provide materials and their properties. These data are formulated for example by metallurgists and do not require any in-depth knowledge of metallurgy on the part of the user of the inventive EDP system. This means that the designer does not initially have to procure extensive knowledge in order to then dismiss it anyway because it is not necessary for the present case but instead it is simply available to him.

The libraries for standard parts are also subject to the specialist knowledge of the experts responsible for this and also of market strategists who research the availability of standard parts and also input this into the libraries.

EXAMPLE

The functioning of the inventive EDP system will now be described using a real design example:

Task: A truss is to be designed which sustains a vertical static load of 2000 N, with a distance of 250 mm from the vertical screw area, via a pin guided in a bore of the truss with D=20 h 9 mm. The bending of the truss upon incorporation of the pin may not thereby exceed a value of 0.050 mm.

Figure 6:
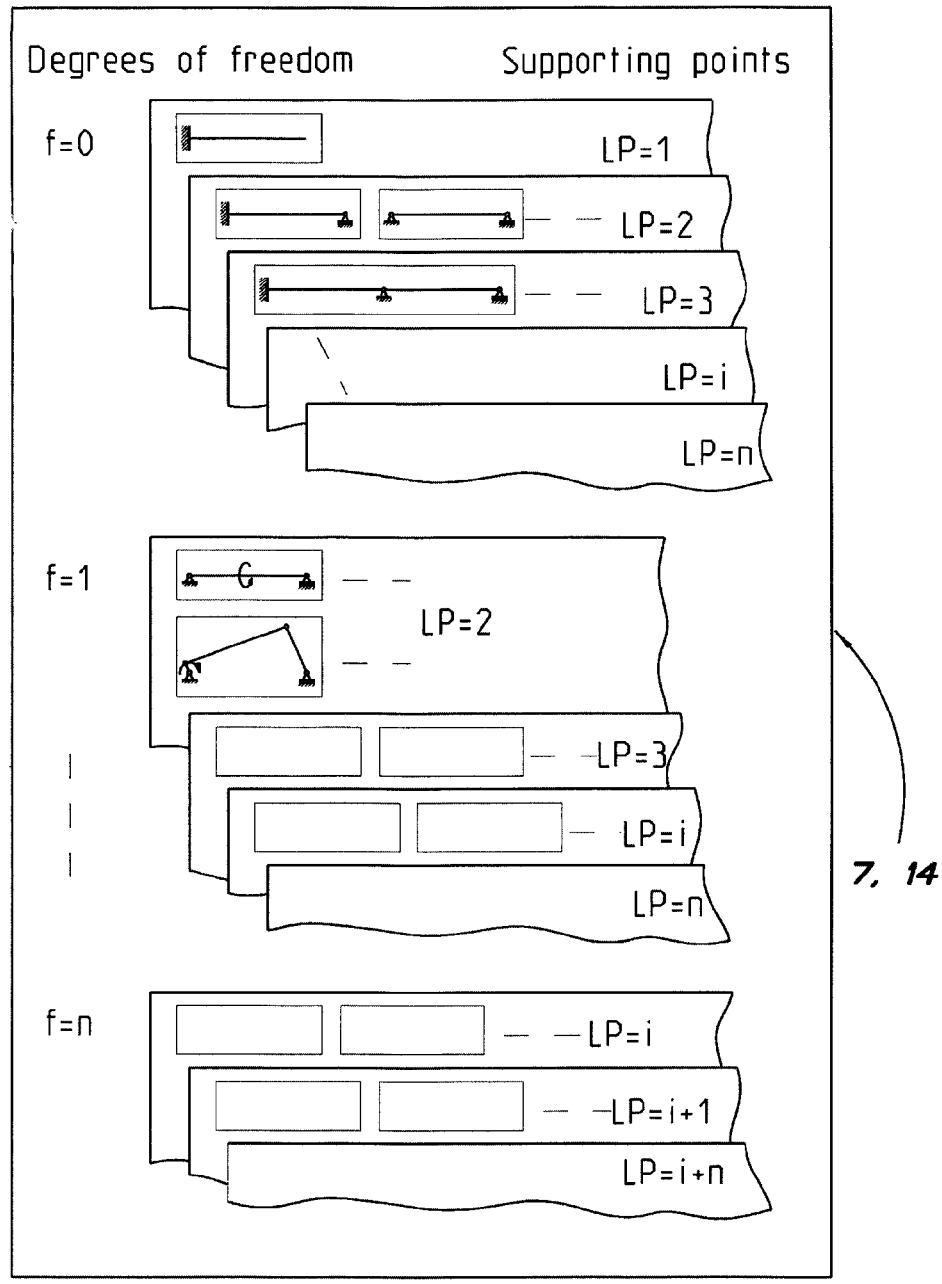
FIG. 6 shows an illustrative selection possibility of a kinematic model.
Figure 7:
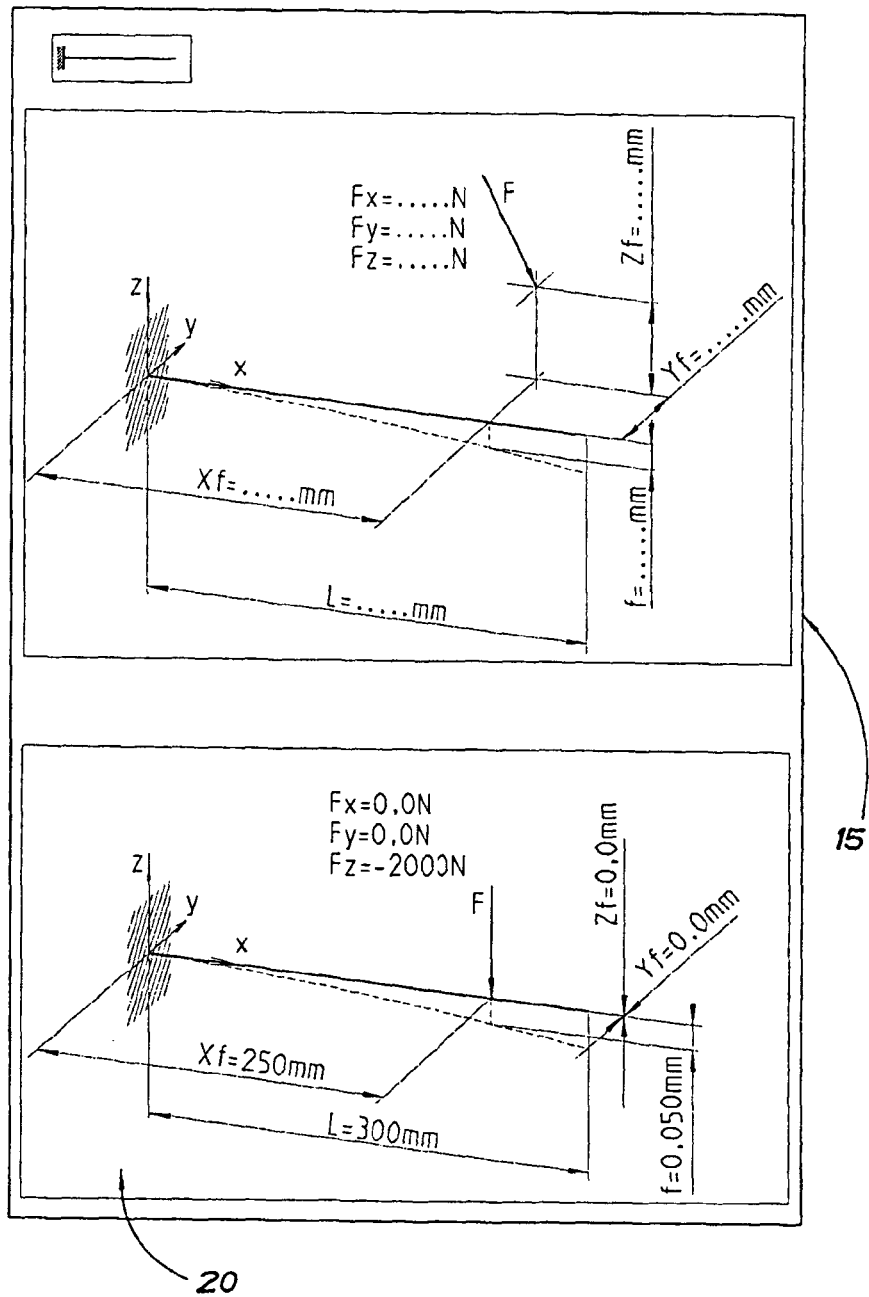
FIG. 7 shows an illustrative input of the forces and the representation of the input.
Figure 8:
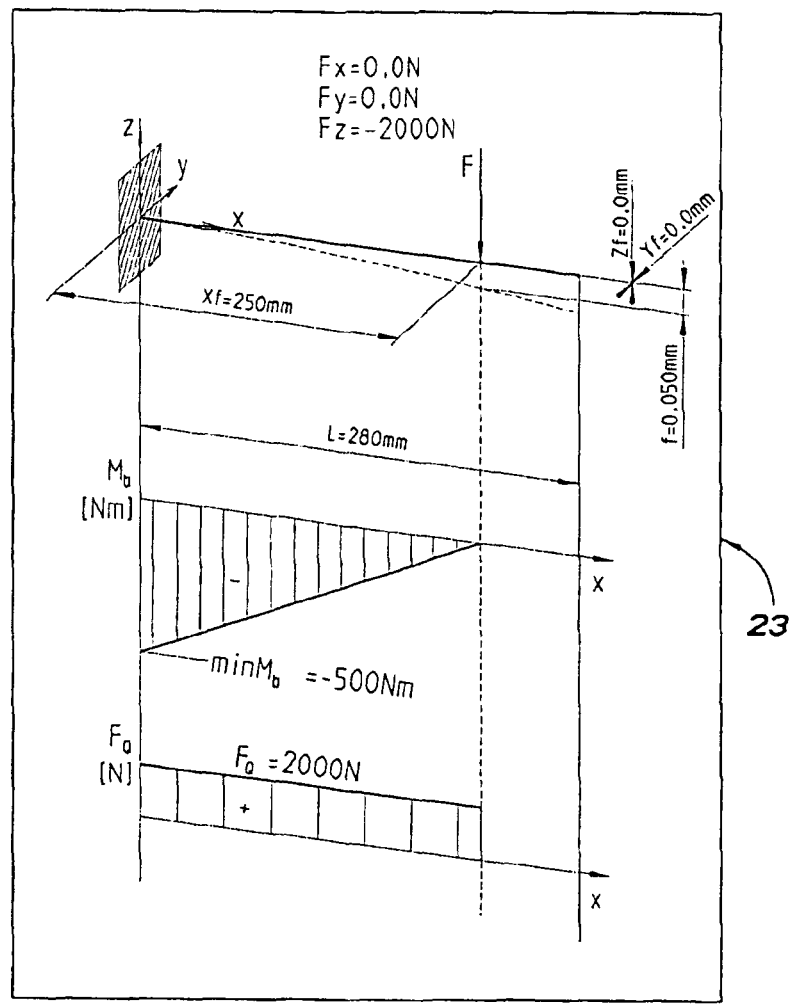
FIG. 8 shows an illustrative representation of the forces and moments on the selected kinematic model.
Figure 9:
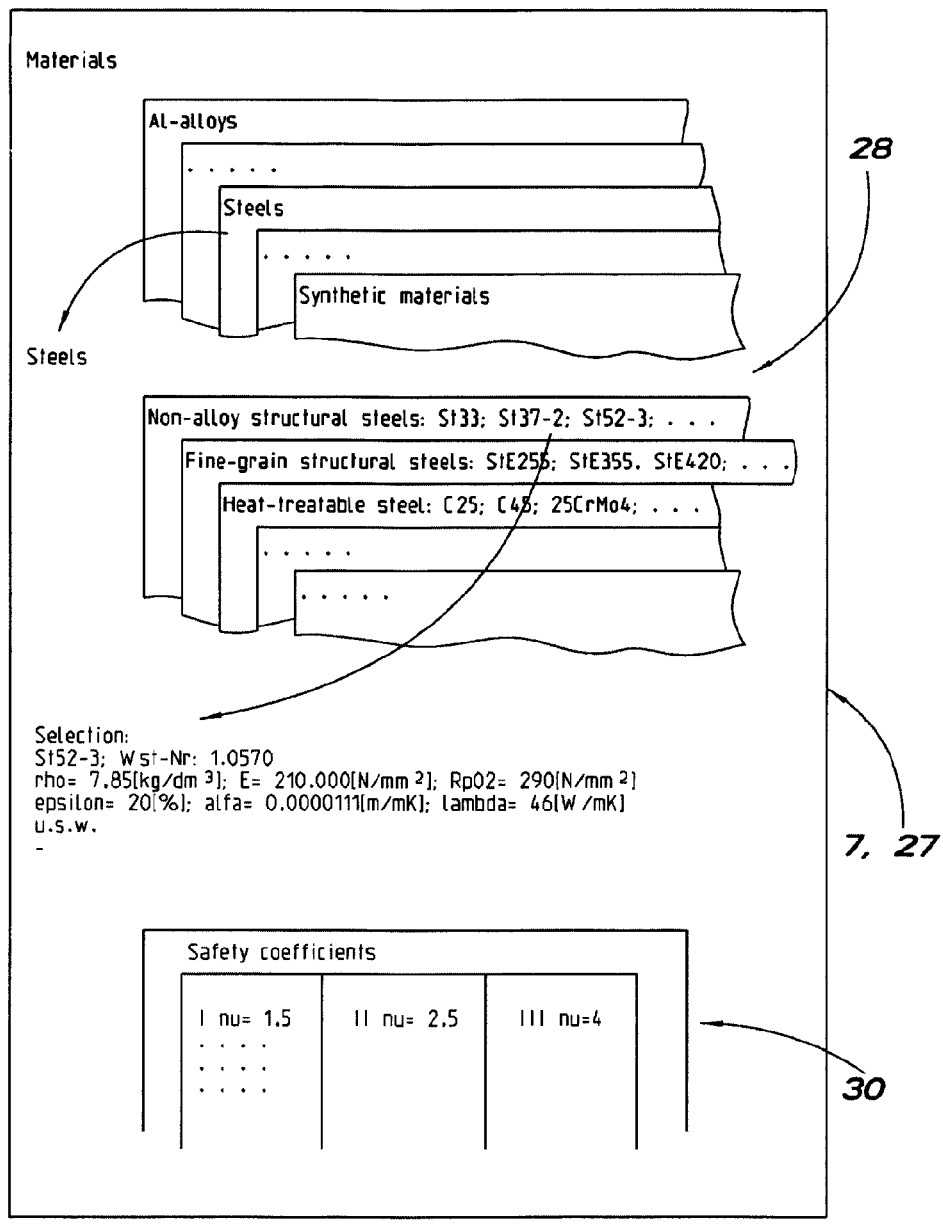
FIG. 9 shows illustrative selection possibilities for materials and safety coefficients.
Figure 10:
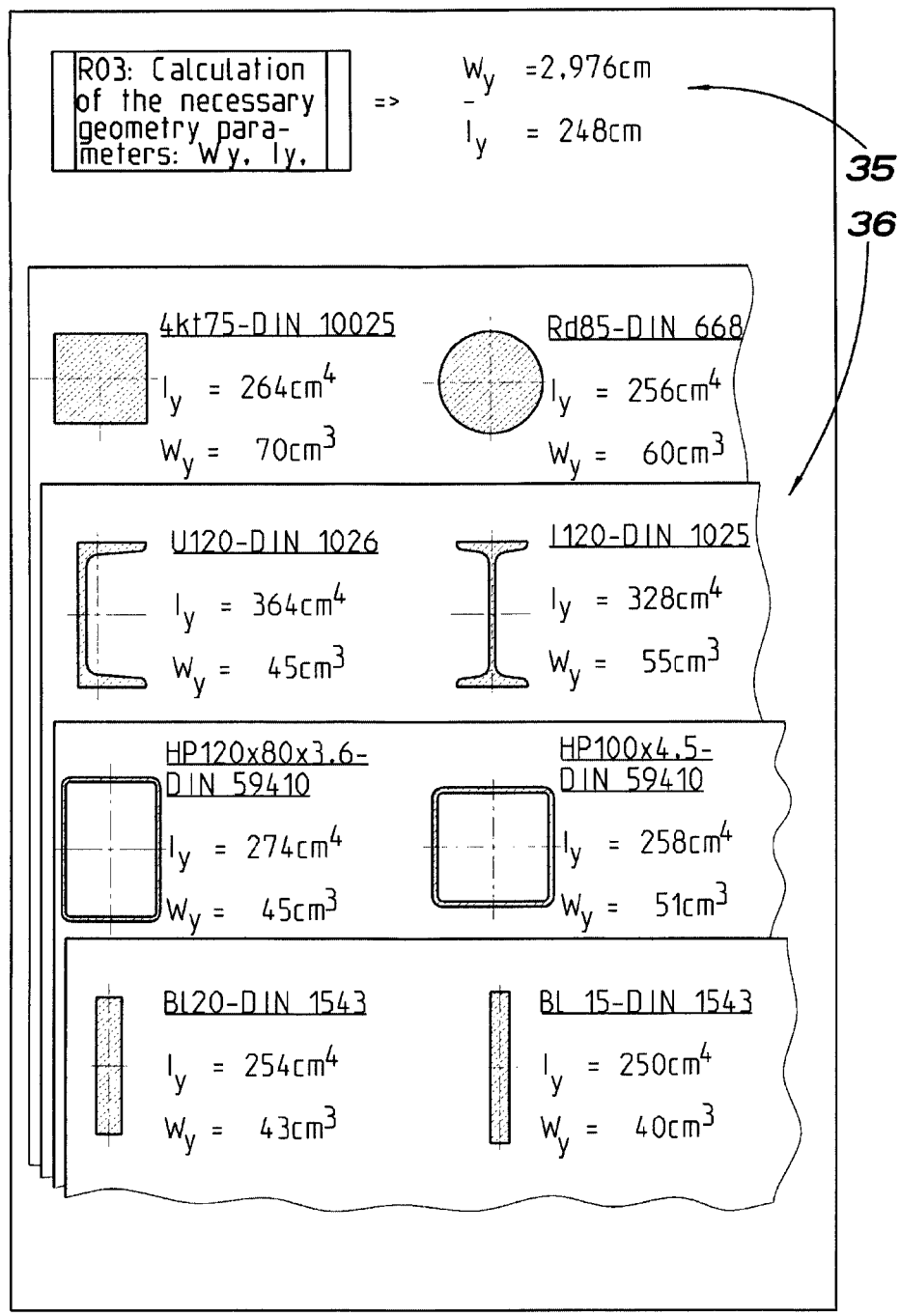
FIG. 10 shows illustrative calculated cross-section data and the cross-section alternatives offered.
Figure 11:
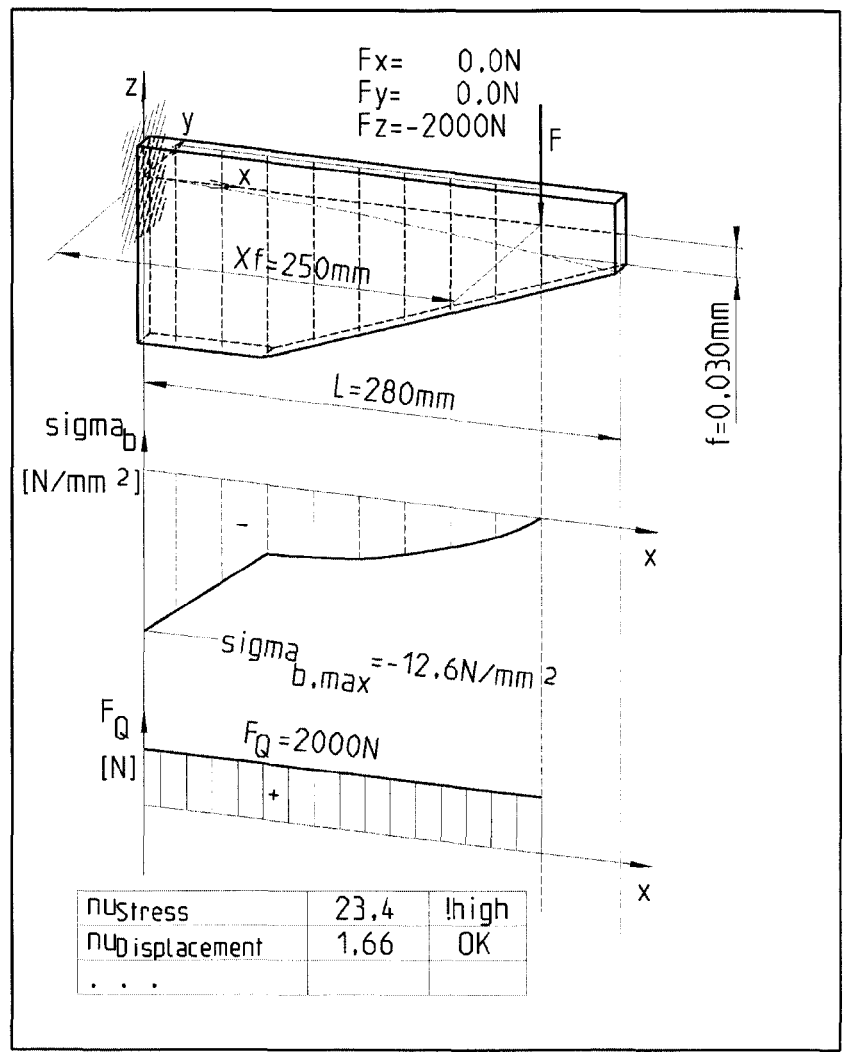
FIG. 11 shows illustrative stresses prevailing in the selected cross-sections and the comparison between the achieved and required safety coefficients.
Figure 12:
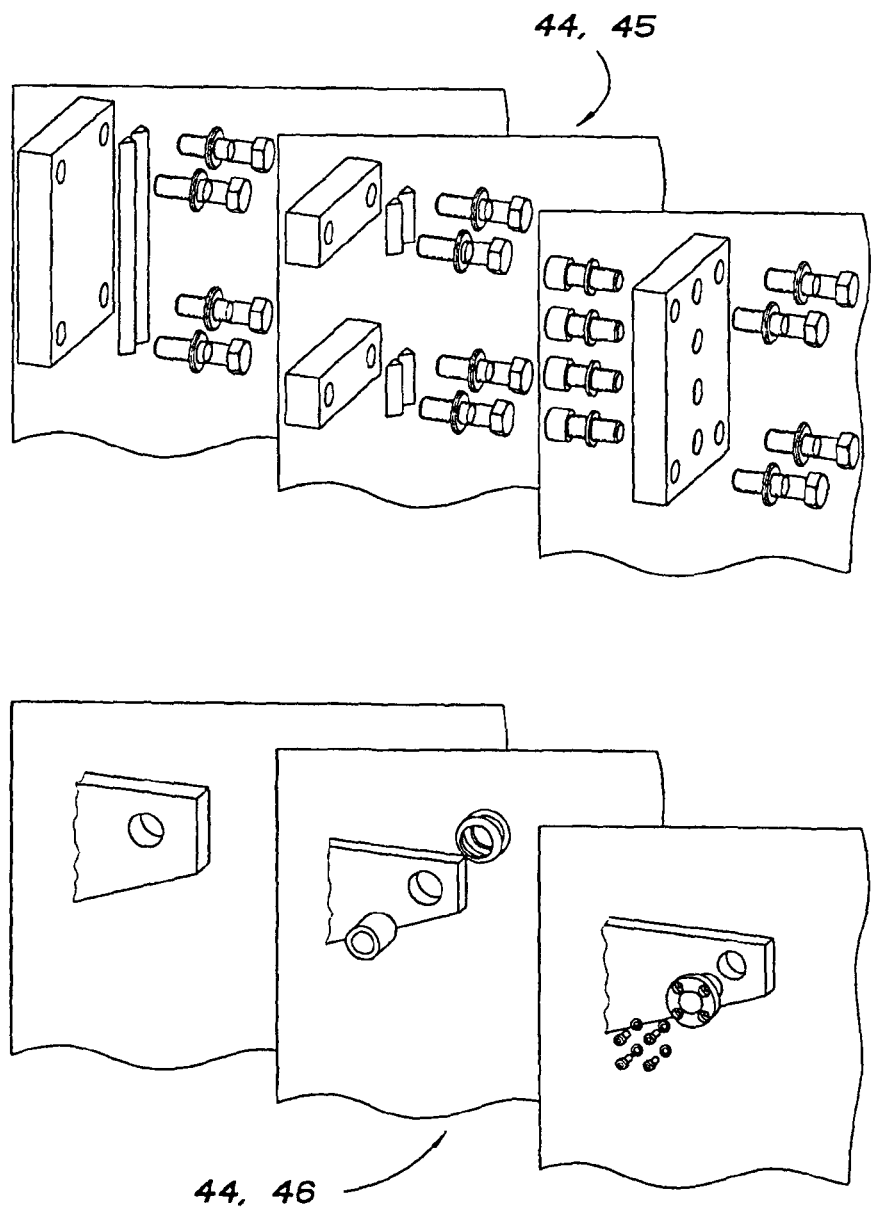
FIG. 12 shows illustrative selection possibilities for fixing elements and force application elements.
Figure 13:
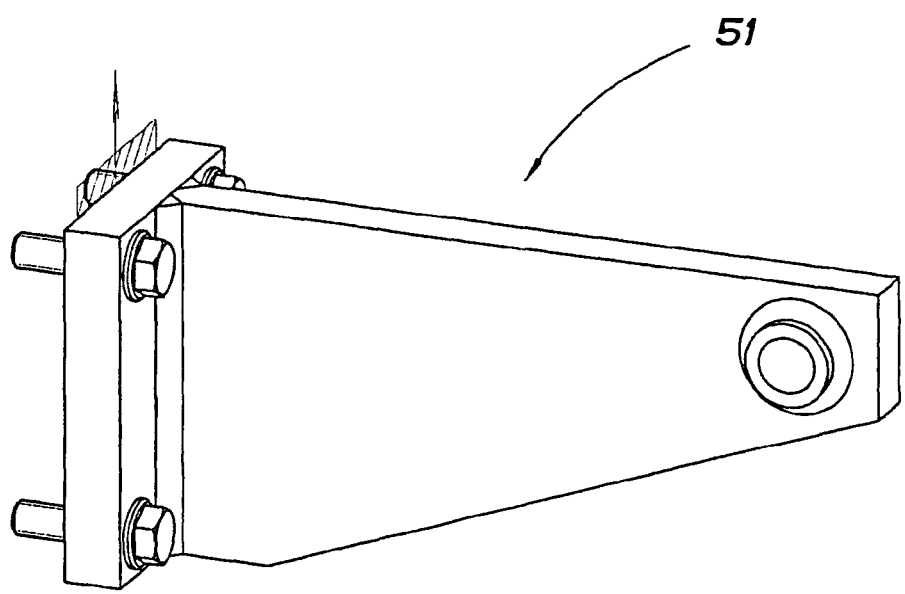
FIG. 13 shows an illustrative whole model generated by the method.
Figure 14:
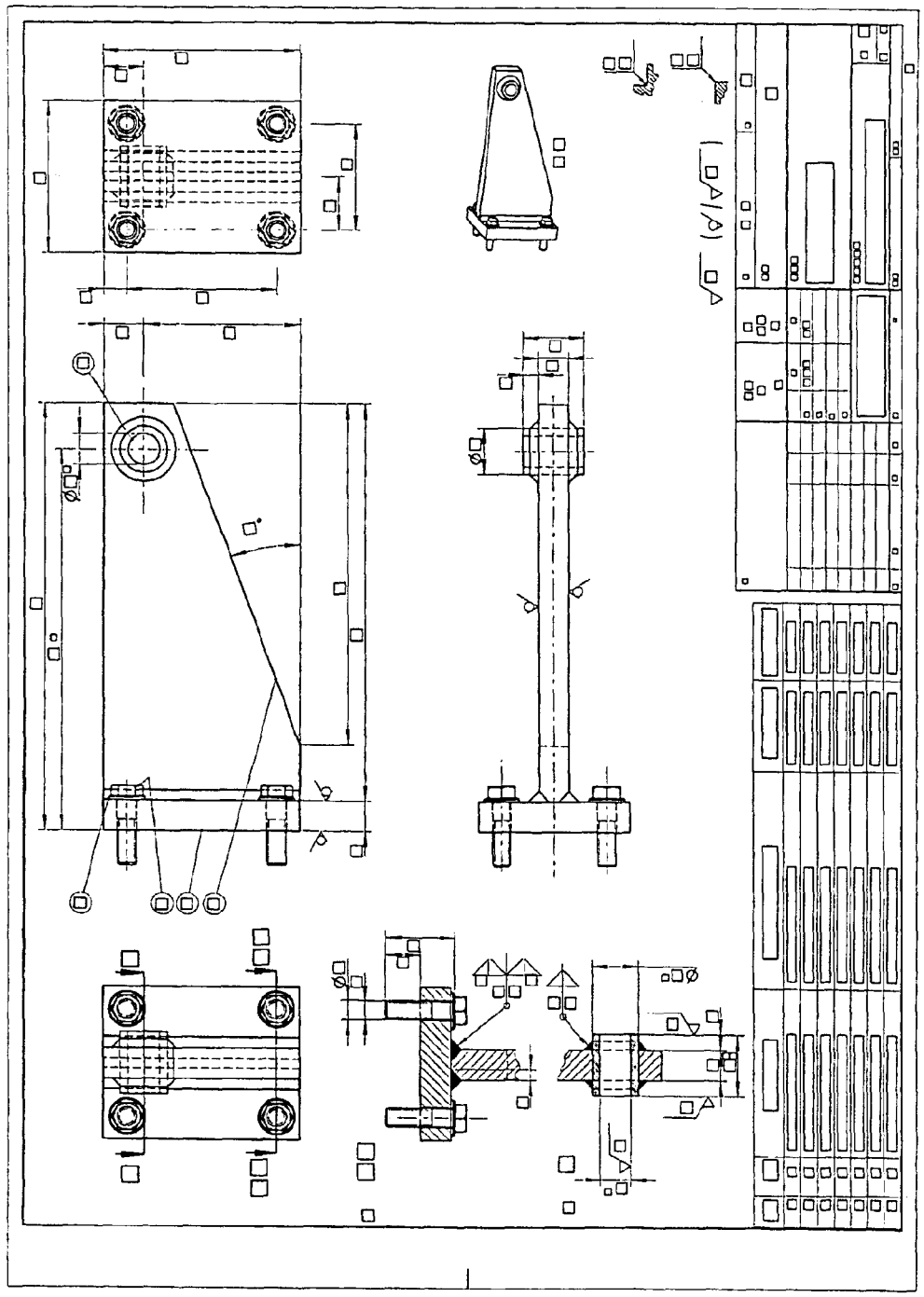
FIG. 14 shows an illustrative technical drawing formulated by the method.

Firstly, as shown in FIG. 6, according to 15, a kinematic model is selected from the library 14. The kinematic model of a truss is found here which corresponds to our requirements with the number of the degrees of freedom f=0 and the number of supporting points LP=1. The required indications are input as in FIG. 7, following which they are set out via the user interface 4, 20. The inputs are checked 21 and subsequently the calculation of the cutting forces and moments is carried out by the computer unit according to analytical formalisms 22. Then the results are set out 23 as in FIG. 8. Checking follows and then 27 the selection of the material, FIG. 9, from 28 and the safety coefficients from 30. A selection of a blank can take place later. The necessary geometry parameters are now determined 35 by the computer unit and suggestions for geometries 36 are set out on the user interface (FIG. 10). We select 37 the suggestion "B120-DIN 1543". The calculation of the stresses and the deformations is now carried out 39 by the computer unit and set out together with the achieved safety coefficients 40 on the user interface, following which the verification of said safety coefficients is carried out 41. In FIG. 11 this representation is shown and a warning is output for the safety coefficient of the stresses—it is too high. For our case, however, the deformation of 0.050 mm is a design specification, of which the safety coefficient lies with 1.66 to 0.030 mm in the admissible range. We take the higher weight and the correspondingly very low stresses into account—for reasons of production costs—and go to the next step 43. Now, 44, as shown in FIG. 12, the fixing elements are selected from 45 and the force application elements from 46 as well as the standard parts from 47. These are then adapted by the computer unit to our truss 48 and set out 49 on the user interface, FIG. 13. As we do not wish to carry out any further optimisations 50, 54 and 56 the next step follows. Here, 57, we select a DIN A3 format from 58 with the corresponding item list which is also to be indicated in the assembly drawing. The computer unit assumes the arrangement of the views, the scale and the dimensions 61 and the drawing is represented 62 on the user interface, FIG. 14. As we are not carrying out any additional processing 65 the thus formulated technical drawing is stored 66 and is available for the further production process.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

LIST OF REFERENCE NUMERALS

1—Inventive EDP system
2—Storage unit
3—Computer unit
4—User interface
5—interface
6—Designer (user)
7—Stored data
8—Suggestions
9—Data to be added
10—Consistency check
11—Calculations
12—Invitation to input
13—Transition to the next method step
14—Library with kinematic models
15—Selection possibility of kinematic models
16—Decision point (1) for kinematic models
17—Gear synthesis
18—Library with functions for kinematic models
19—Library for new kinematic models
20—Representation of the forces and boundary conditions
21—Decision point (2) for kinematic model
22—Calculation of the cutting forces and moments
23—Representation of the force and moment patterns
24—Decision point (3)
25—Return to start again
26—Acceptance of the status quo
27—Selection of the material
28—Library with materials
29—Library with dimension sheets of profiles and blanks
30—Library with safety coefficients and instructions
31—Library with instructions for manufacture, thermal and surface treatments
32—Libraries with simple geometries
33—Generation of geometries
34—Libraries with compiled geometries
35—Calculation of the required geometry parameters
36—Representation of the geometry suggestions
37—Selection of the geometry
38—Decision point (4) concerning the suitability of the geometry
39—Calculations of the stresses and displacements using analytical formalisms 40—Representation of the achieved safety coefficients, loads and critical points
41—Decision point (5) relating to critical points
42—Possibility of going back
43—Acceptance of the status quo
44—Selection of the fixing elements and force application elements
45—Library with fixing elements
46—Library with force application elements
47—Library with standard parts
48—Calculation of the loads of all parts using analytical formalisms
49—Representation of the model with the selection elements
50—Decision point (6)
51—Representation of the loads and the safety coefficients on all parts (also for the case of external calculation)
52—Decision point (7) for the use of a non-analytical process
53—Non-analytical calculations
54—Acceptance of the status quo
55—Decision point (8) for the evaluation of the loads and safety coefficients
56—Acceptance of the status quo
57—Selection of the drawing formats
58—Libraries with drawing formats, item list forms and other forms
59—Library with additional drawing elements
60—Library with comments and texts
61—Adaptation of the views and calculation of the dimensioning representation
62—Representation of the drawings
63—Manual processing of the drawings
64—Representation of the complete documentation
65—Decision point (9)
66—Storage of the design
67—Method for automatic design

The invention claimed is:

1. An electronic data processing (EDP) system for automatic or semi-automatic design, comprising:
  at least one storage unit in which databases are created, which include, based on findings from technical sciences, standard and/or non-standard, kinematic, kinetic, material, geometric, and form-related data, admissible and/or inadmissible deviations thereof, analytical and synthetic calculation formalisms and application instructions thereof;
  at least one computer unit on which the formalisms are carried out and on which results of the formalisms are compared with known data and evaluated;
  at least one user interface on which a user can, via a menu structure, make selections, input data, and output results; and
  at least one interface to other EDP systems;
  wherein the computer unit:
    leads the user through an iteration sequence of synthesis and analysis of a future useful technical object;
    offers to the user via the menu structure selection possibilities originating from the storage unit of kinematic, kinetic, material, geometric and form-related data;
    prompts the user to select the data corresponding to a task;
    processes, stores and compares the data with known data contained in the storage unit;
    displays the processed data and the results of the comparison on the user interface, informs the user of admissible and/or inadmissible deviations, and invites the user to carry out further decisions and data inputs, for as long as all deviations lie within admissible ranges; and
    by reference to the form-related instructions stored in the storage unit, formulates technical documentation with manufacturing and operating instructions for the future useful technical object, stores the technical documentation, and makes the technical documentation available to the user on the user interface for further processing.

2. The EDP system according to claim 1, wherein:
suggestions are made to the user by the computer unit for the selection of a kinematic model;
the user makes a selection of a kinematic model; and
the user fixes and quantifies boundary conditions and loads in the selected kinematic model;
wherein the computer unit:
  calculates cutting forces and moments associated with the selected model; and
  displays the calculated cutting forces and moments to the user via the user interface;
and wherein the user:
  can accept the displayed model;
  can input other boundary conditions and forces; or
  is offered another kinematic model and repeats the process.

3. The EDP system according to claim 2, wherein:
suggestions are made to the user by the computer unit for the selection of materials, simple and compiled geometric forms, blanks and safety coefficients;
the user makes all necessary selections; and
the user completes any missing dimensions displayed on the user interface;
wherein the computer unit formulates, using the kinematic model, a kinetic model, calculates stresses and safety coefficients arising in the model elements, displays the stresses and safety coefficients to the user via the user interface, and refers to points in the model where the safety coefficients have fallen short or have been exceeded;
and wherein the user can:
  accept the displayed data; or
  is prompted to carry out any necessary changes in the inputs so that the results, corresponding to the stored instructions, are consistent.

4. The EDP system according to claim 3, wherein:
suggestions are made to the user by the computer unit for the selection of parametric fixing elements, force application elements, and standard parts necessary for the application;
wherein the user makes the necessary selections and positioning via the user interface, wherein the selected elements are incorporated into the existing kinetic model by the computer unit corresponding to the stored instructions, and wherein missing dimensions are completed by the user;
wherein the computer unit carries out a new calculation of the stresses, the safety coefficients, and the loads of the standard parts and publishes the results via the user interface and indicates the points at which the safety coefficients have fallen short or have been exceeded;
wherein the user makes the necessary adjustments;
and wherein the computer unit carries out a new calculation and again displays the results now achieved on the user interface.

5. The EDP system according to claim 4, wherein the computer unit makes suggestions to the user for the calculation and/or simulation in other programs running in parallel in order to confirm or refine the present results.

6. The EDP system according to claim 5, wherein the computer unit makes suggestions to the user for the formulation of standard technical drawings, wherein the user selects the format and the computer unit automatically, based on the stored instructions, sets a minimum number of views, sections, enlarged details, necessary dimensions, and tolerances in the drawings, then displays these to the user via the user interface, and wherein the user can carry out further indications in the drawings and carry out the selection of an output type.

7. The EDP system according to claim 1, wherein the user can, at any time during the sequence of the method, go back to any previous point of the method and carry out corresponding changes.

8. The EDP system according to claim 1, wherein the user can formulate individual parts, components, or drawings and use the individual parts, components, or drawings in the current process or in a later process.

9. The EDP system according to claim 1, wherein the method has access to the data stored in the storage unit in the form of libraries, and wherein the method invites the user at a certain time to make selections from these libraries which the method requires for further work.

10. The EDP system according to claim 9, wherein the libraries are constructed so that they contain in their content information concerning the state of the art of mechanisms and gearing, materials, blanks and profiles, standard parts, common market purchased parts, manufacturing processes, technical standards, and information concerning geometry, and wherein this content can be supplemented by specialist staff and also by the individual user.

11. Method for automatic or semi-automatic design of a future useful technical object, wherein the method represents an iterative synthesis-analysis sequence and comprises:

a designer selecting, from a library with kinematic models, a model which corresponds to a task, wherein the designer enters boundary conditions and loads into the model;

calculating cutting forces and moments;

selecting a material and safety coefficients from a library, corresponding to the task;

calculating necessary geometry parameters of cross-sections;

selecting, by the designer, from a library with cross-sectional forms which correspond to the calculated geometry parameters, one or more cross-sectional forms favorable for the task;

calculating stresses and effective safety coefficients prevailing in the material and comparing the calculated stresses and effective safety coefficients with reference values;

checking, by the designer, the effective safety coefficients, and deciding whether to accept the selected cross-sectional form or to select another cross-sectional form;

selecting, by the designer, from a library, fixing elements and force application elements suited for the task and associated standard parts;

mutually adjusting the fixing elements and force application elements and the existing structure, determining the stresses and safety coefficients in all parts including the standard parts, and comparing with the reference values;

in case of deviations from the reference values, repeating the mutual adjusting using other fixing elements and force application elements and standard parts;

if required, repeating a plurality of the above steps until the safety coefficients are within admissible ranges;

selecting, by the designer, from a library, drawing formats, item list forms, or other forms, and displaying the designed object;

displaying at least the necessary views, sections, or details in the selected formats, dimensioning the design object in line with standards, and formulating the item lists and other forms corresponding to the task; and supplying the design or the technical documentation of the design object for further processing.

12. A non-transitory storage medium for storing a computer-implemented method according to claim 11, wherein the method is carried out on a computer.

* * * * *